United States Patent [19]
Robinson et al.

[11] Patent Number: 4,675,832
[45] Date of Patent: Jun. 23, 1987

[54] VISUAL DISPLAY LOGIC SIMULATION SYSTEM

[75] Inventors: Gordon D. Robinson, Fareham; Brian D. V. Smith, Southampton, both of United Kingdom

[73] Assignees: Cirrus Computers Ltd.; United Kingdom and British Telecommunications, both of United Kingdom

[21] Appl. No.: 659,577

[22] Filed: Oct. 11, 1984

[30] Foreign Application Priority Data

Oct. 13, 1983 [GB] United Kingdom ................. 8327350
Oct. 17, 1983 [GB] United Kingdom ................. 8327718

[51] Int. Cl.$^4$ ..................... G06F 15/60; G06K 15/00; G09B 19/00
[52] U.S. Cl. .................................. 364/521; 340/705; 364/488; 434/224
[58] Field of Search ............... 340/701, 703, 715, 722, 340/733, 705; 324/73 R; 371/19, 25, 29; 364/521, 578, 488, 489, 481, 140, 141, 490, 491; 434/224

[56] References Cited

U.S. PATENT DOCUMENTS 3,366,950  1/1968  Wilson ................................ 340/705
4,525,667  6/1985  Sawano et al. ................. 324/140 R

OTHER PUBLICATIONS

Berg, Charles R., "Computer Graphics Displays: Windows for Process Control", *IEEE Computer Graphics and Applications*, May/Jun. 1983, pp. 43–55.
Tudhope et al., "A High-Level Recogniser for Schematic Diagrams", *IEEE Computer Graphics and Application*, May/Jun. 1983, pp. 33–40.
Daniel et al., "CAD Systems for IC Design", IEEE Trans. on Computer-Aided Design of Integrated Circuits and Systems, vol. CAD-1, No. 1, Jan. 1982, pp. 2–12.

*Primary Examiner*—Errol A. Krass
*Assistant Examiner*—Daniel W. Juffernbruch
*Attorney, Agent, or Firm*—Limbach, Limbach & Sutton

[57] ABSTRACT

An improved logic simulation system including a logic simulator which provides the logic states of elements within an electronic circuit being analyzed, means for associating the logic states with a schematic image of the electronic circuitry for display on a visual display device, wherein the improvement includes means for designating the color of the element being displayed which color represents the logic state of the element for a selected point in time.

17 Claims, 13 Drawing Figures

| WIRE | LOGIC STATE |  |  |  |  |  |
|---|---|---|---|---|---|---|
|  | $T_N$ | $T_{N+1}$ | $T_{N+2}$ | $T_{N+3}$ | $T_{N+4}$ | $T_{N+5}$ | ... |
| W1  | 1 | 1 | 1 | 1 | PD3 | 0 |
| W2  | 1 | 1 | 1 | 1 | PD3 | 0 |
| W3  | 1 | 1 | 1 | 1 | PD3 | 0 |
| W4  | 0 | 0 | 0 | PD3 | 1 | 1 |
| W5  | 0 | 0 | 0 | PD3 | 1 | 1 |
| W6  | 0 | 0 | 0 | PD3 | 1 | 1 |
| W7  | 0 | PD2 | 1 | 1 | 1 | 1 |
| W8  | 0 | 0 | 0 | 0 | 0 | 0 |
| W9  | 1 | 1 | 1 | 1 | 1 | 1 |
| W10 | 1 | PD2 | 0 | 0 | 0 | 0 |
| W11 | 0 | 0 | PD1 | 1 | 1 | 1 |
| W12 | 0 | 0 | 0 | 0 | 0 | 0 |
| W13 | 0 | 0 | 0 | 0 | 0 | 0 |
| ⋮ |  |  |  |  |  |  |
| W25 | 0 | 0 | 0 | 0 | 0 | 0 |
| W26 | 0 | 0 | 0 | 0 | 0 | 0 |
| W27 | 0 | 0 | 0 | 0 | 0 | 0 |
| W28 | 1 | 1 | 1 | 1 | 1 | 1 |
| W29 | 1 | 1 | 1 | 1 | 1 | 1 |
| W30 | 0 | 1 | 1 | 1 | 1 | 1 |

HARDWARE DIAGRAM
FIG. 1A.

SOFTWARE CONFIGURATION
FIG. 5A.

| ELEMENT NAME | SYMBOL TYPE | LOCATION | DEFINITION | | |
|---|---|---|---|---|---|
| | | | ELEMENT | PARAMETERS | OTHER |
| N1 | NAND GATE | $X_1, Y_1$ | LINE | X,Y TO X,Y | — |
| | | | LINE | X,Y TO X,Y | — |
| | | | ARC | X,Y TO X,Y | RADIUS |
| | | | CIRCLE | MIDPOINT X,Y | RADIUS |
| N2 | | | | | |
| W1 | WIRE | X,Y TO X,Y | LINE | X,Y TO X,Y | — |
| W2 | WIRE | X,Y TO X,Y | LINE | X,Y TO X,Y | — |
| INV1 | INVERTER | $X_N, Y_N$ | LINE | X,Y TO X,Y | — |
| | | | LINE | X,Y TO X,Y | — |
| | | | LINE | X,Y TO X,Y | — |
| | | | CIRCLE | MIDPOINT X,Y | RADIUS |
| M1 | MULTIPLEXER | — | — | — | — |

FIG. 4.

| WIRE | LOGIC STATE | | | | | | |
|------|-----|-------|-------|-------|-------|-------|---|
|      | $T_N$ | $T_{N+1}$ | $T_{N+2}$ | $T_{N+3}$ | $T_{N+4}$ | $T_{N+5}$ | ... |
| W1   | 1 | 1 | 1 | 1 | PD3 | 0 | |
| W2   | 1 | 1 | 1 | 1 | PD3 | 0 | |
| W3   | 1 | 1 | 1 | 1 | PD3 | 0 | |
| W4   | 0 | 0 | 0 | PD3 | 1 | 1 | |
| W5   | 0 | 0 | 0 | PD3 | 1 | 1 | |
| W6   | 0 | 0 | 0 | PD3 | 1 | 1 | |
| W7   | 0 | PD2 | 1 | 1 | 1 | 1 | |
| W8   | 0 | 0 | 1 | 0 | 0 | 0 | |
| W9   | 1 | 1 | 1 | 1 | 1 | 1 | |
| W10  | 1 | PD2 | 0 | 0 | 0 | 0 | |
| W11  | 0 | 0 | PD1 | 1 | 1 | 1 | ... |
| W12  | 0 | 0 | 0 | 0 | 0 | 0 | |
| W13  | 0 | 0 | 0 | 0 | 0 | 0 | |
| ...  | | | | | | | |
| W25  | 0 | 0 | 0 | 0 | 0 | 0 | |
| W26  | 0 | 0 | 0 | 0 | 0 | 0 | |
| W27  | 0 | 0 | 0 | 0 | 0 | 0 | |
| W28  | 1 | 1 | 1 | 1 | 1 | 1 | |
| W29  | 1 | 1 | 1 | 1 | 1 | 1 | |
| W30  | 0 | 1 | 1 | 1 | 1 | 1 | |

FIG. 6.

| LOGIC STATE | COLOR |
|---|---|
| 1 | RED |
| 0 | BLUE |
| X (UNKNOWN) | MAGENTA |
| Z (HIGH IMPED.) | YELLOW |
| H (WEAK HIGH) | RED |
| L (WEAK LOW) | BLUE |
| DELAY | GREEN |

FIG. 7.

| ELEMENT NAME | SYMBOL TYPE, LOCATION, DEFINITION | TIME | | | | | | |
|---|---|---|---|---|---|---|---|---|
| | | $T_N$ | $T_{N+1}$ | $T_{N+2}$ | $T_{N+3}$ | $T_{N+4}$ | $T_{N+5}$ | ... |
| W1  | | RED   | RED   | RED   | RED   | GREEN | BLUE | |
| W2  | | RED   | RED   | RED   | RED   | GREEN | BLUE | |
| W3  | | RED   | RED   | RED   | RED   | GREEN | BLUE | |
| W4  | | BLUE  | BLUE  | BLUE  | GREEN | RED   | RED  | |
| W5  | | BLUE  | BLUE  | BLUE  | GREEN | RED   | RED  | |
| W6  | | BLUE  | BLUE  | BLUE  | GREEN | RED   | RED  | |
| W7  | | BLUE  | GREEN | RED   | RED   | RED   | RED  | |
| W8  | | BLUE  | BLUE  | BLUE  | BLUE  | BLUE  | BLUE | |
| W9  | | RED   | RED   | RED   | RED   | RED   | RED  | |
| W10 | | RED   | GREEN | BLUE  | BLUE  | BLUE  | BLUE | |
| W11 | | BLUE  | BLUE  | GREEN | RED   | RED   | RED  | ... |
| W12 | | BLUE  | BLUE  | BLUE  | BLUE  | BLUE  | BLUE | |
| W13 | | BLUE  | BLUE  | BLUE  | BLUE  | BLUE  | BLUE | |
| ... | | | | | | | | |
| W25 | | BLUE  | BLUE  | BLUE  | BLUE  | BLUE  | BLUE | |
| W26 | | BLUE  | BLUE  | BLUE  | BLUE  | BLUE  | BLUE | |
| W27 | | BLUE  | BLUE  | BLUE  | BLUE  | BLUE  | BLUE | |
| W28 | | RED   | RED   | RED   | RED   | RED   | RED  | |
| W29 | | RED   | RED   | RED   | RED   | RED   | RED  | |
| W30 | | BLUE  | RED   | RED   | RED   | RED   | RED  | |

VISUAL DISPLAY LOGIC SIMULATION SYSTEM

DESCRIPTION

1. Technical Field

The present invention is directed generally to systems for simulation and testing of electronic circuitry and devices and, more particularly, to a logic simulator which provides a visual display of the schematic representation of the circuit or device being tested. The invention provides a visual display system whereby a computer simulated operation of a digital logic circuit can be displayed and hence any faults in its operations or potential defects in the circuit can be identified and appropriate corrective action taken.

2. Background Art

In computer aided design (CAD) systems, it is known to produce a visual representation of the circuit as designed, either as a printed drawing or as a display on a television screen showing the various circuit elements in functional form (e.g., AND gates, NOR gates etc.), and the interconnections between each. It is also known to produce a table which details the logical state (ie. '0' or '1') at each of selected nodal points in the circuit, during successive periods in the operating cycle of the circuit. While such tables are useful to the circuit designers for checking the operation of the circuit, it is very difficult, and in the case of the complicated circuits virtually impossible for the overall operation of the circuit to be visualized, and the identifying of faults in the circuit is difficult.

In previous logic simulation systems, the user typically communicates with the system through a terminal and visual display. Often, the information displayed on the visual display comprises a plurality of waveforms which represent the response of the circuit over a period of time, each waveform representing a selected point in the electronic circuit. Alternatively, the logic states are represented in alphanumeric form for a selected number of time intervals. From the point of view of the user the above logic state formats are not readily associated with the circuit schematic; that is, the user of such a system is required to work between the waveform or logic state display on the terminal and a schematic drawing positioned apart from the terminal. In moving from the display to the schematic drawing, information is often lost, or misplaced in the user's mind.

Other prior simulation systems feature a graphics display upon which a visual image of the electronic schematic is displayed. Typically, the logic states of each element in the circuit are displayed in alphanumeric form at the input and output nodes of the element. While this display format solves the problem of associating logic states with the schematic diagram, there remains the difficulty of tracing the progression of logic states through the circuit.

DISCLOSURE OF THE INVENTION

According to the invention there is provided a visual display system comprising means for producing a visual representation of a digital electronic circuit on a display screen, and means for indicating on the screen the logical state of some or all of the constituent parts of the elements of said circuit for specified input conditions to said circuit, and control means for varying said indications of logical state in dependence upon variations in the inputs to said circuit and the reaction of the various elements of said circuit to said variations.

In one aspect the present invention provides an improved logic simulation system of the type including a logic simulator responsive to a logical description of the circuit to be simulated and to input and output stimulus states which provides logic state information about the circuit response as a function of time, schematic and display formatting means responsive to the logic state information and to schematic element definitions and locations of the circuit to be simulated, for providing element definition, location and logic state information to display processor means, wherein the display processor means convert said information into a visual image, and further wherein the improvement comprises formatting means responsive to the logic state information and to the schematic element definitions and locations for inserting a color designation into the element definition which designates the color in which the element is to be displayed. The colors are selected according to the logic state of the particular element.

In the preferred embodiment of the present invention, the logic elements of the circuit are displayed as interconnected by wires and the color with which these wires are displayed is selected according to the logical state of the wire. Thus, the user can easily trace the logical progression of a signal through the circuit.

The present invention provides a quick and simple aid to the user of a logic system which permits the user of the logic system to quickly comprehend the cause and effect and the logical paths of various logical events during the operation of a logic simulation system.

In another aspect the present invention provides an improved logic simulation system, including a logic simulator, which provides the logic states of the electronic circuit being simulated, a visual display which displays a schematic of the electronic circuit being simulated, and means for inserting into the definition of each element in the display schematic, a designation of the color with which the element is to be displayed, which color represents the logical state of the element.

In a further aspect the present invention provides a logic simulation system including display means for displaying a schematic diagram of the logic circuit being simulated wherein the logic states of each of the elements in the schematic diagram are displayed in terms of selected colors.

In another aspect the present invention provides a logic simulation system having a visual display of the circuit being simulated, wherein the logical states of the elements therein are displayed in predetermined colors.

These and other aspects, objectives, features and advantages of the present invention will be more readily understood upon consideration of the following detailed description of the invention and accompanying drawings given by way of example.

DETAILED DESCRIPTION OF THE INVENTION

Figure 1A:
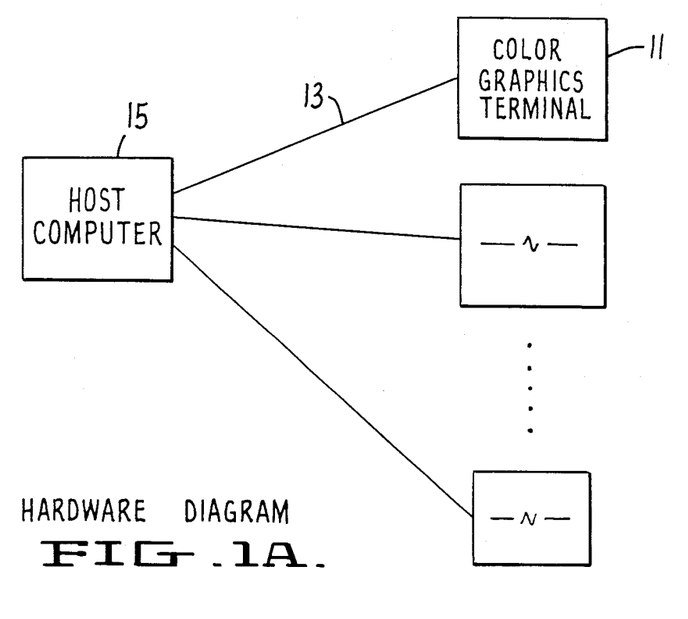
FIGS. 1a and 1b are functional block diagrams of the present invention.
Figure 1B:
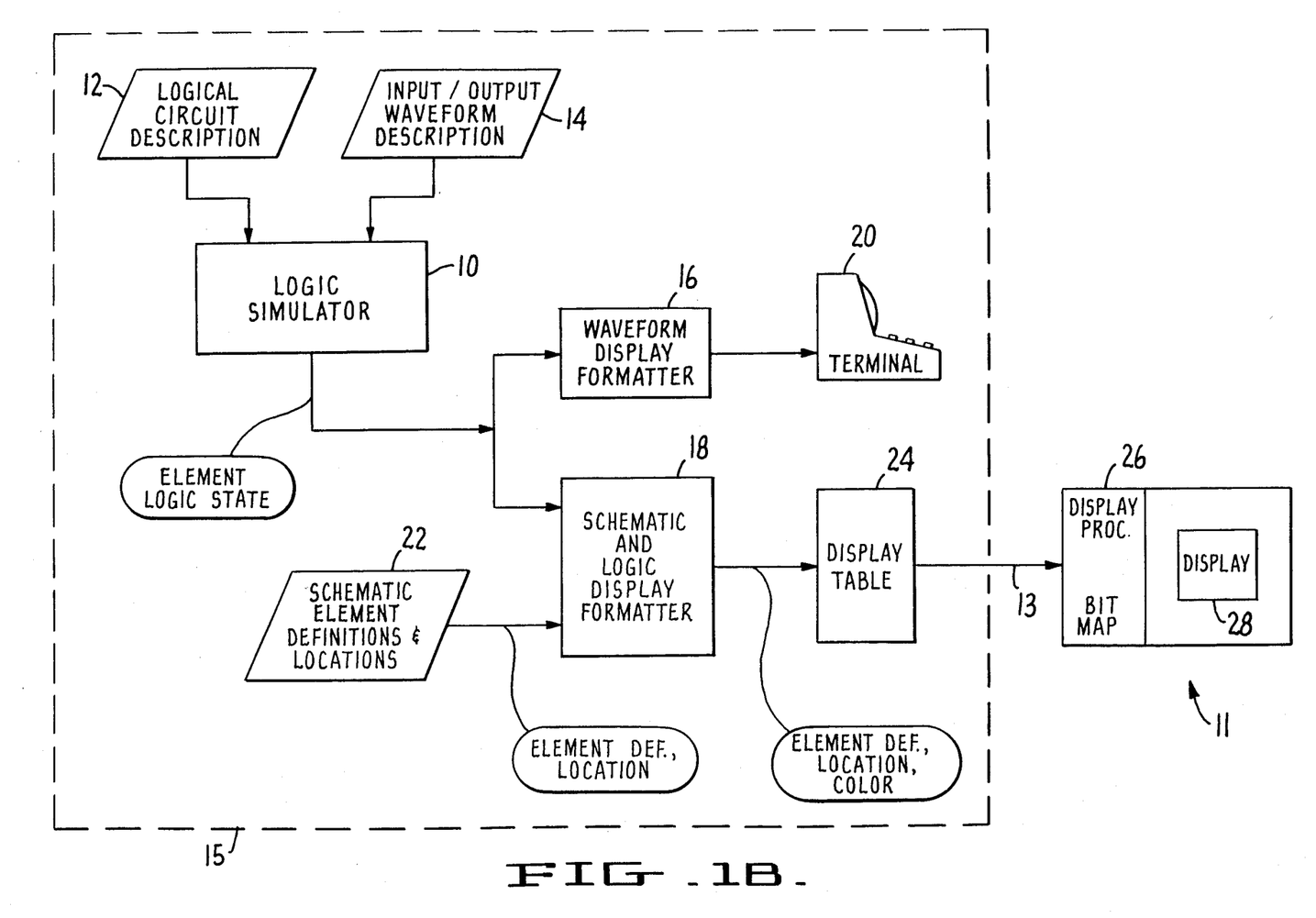
Figure 5A:
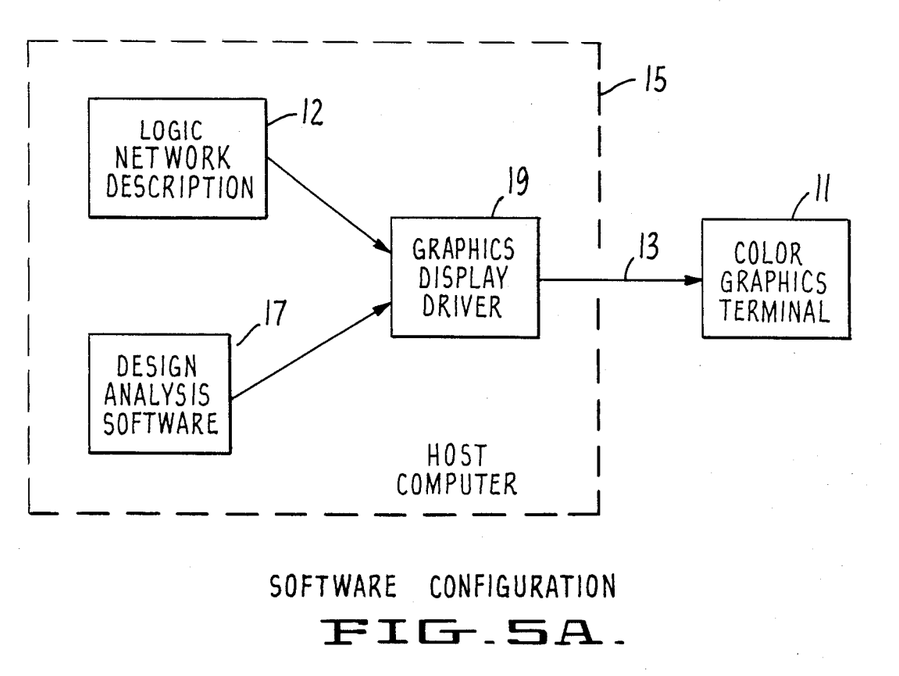
FIGS. 5a and 5b are flow diagrams which illustrate the manner in which colors are designated for the schematic display.

Referring to FIGS. 1a, 1b, and 5a, generally, the function performed by the system of the invention is the graphical display of the logical states within the software representation of a digital electronic circuit which is undergoing design analysis in a manner that will be easily comprehended by the user of the design analysis software.

To this end a graphics terminal 11 displays a diagram of the circuit being simulated with the logical state of each part of the circuit being indicated by annotation of the displayed logic diagram. Either a monochrome graphics terminal is used in which case logic states are indicated by means of alphanumeric annotation of the displayed circuit; alternatively a color graphics terminal is used and the logic state of each connection within the circuit is indicated to the user by variation of the color of the circuit connections displayed by the terminal.

The simulation program can be mounted on a host computer 15 with communication to one or more graphics terminals 11 via a data link 13; alternatively the design analysis software can be mounted on the graphics terminal 11 itself. It is to be understood that the present invention can also have functional parts which are resident in different physical processors.

The system translates a description of the logical structure of the circuit, known as the network description 12, into a form suitable for transmission to the graphics terminal 11. The design analysis software 17, which can be resident in a logic simulation block such as logic simulator 10, FIG. 1b, is provided with a description of the logical stimuli or tests, see Input/Output Waveform Description Information block 14, to be applied to the software model of the circuit held by it. Such logical stimuli or tests may be generated manually or automatically. The design analysis software will determine the effect of the logical stimuli or tests upon the software model of the circuit held by the simulator.

Further software 19 within the system, which can be resident in a display formatter block such as Schematic and Logic Display Formatter 18, FIG. 1b, will accept as its input the logic values calculated by the design analysis software 17 as being the response of the software model of the circuit to each change in the logical stimuli or test applied to the circuit. The logic values calculated are translated in such a way that either one or more alphanumeric characters or a color is associated with each connection within the circuit in such a way that both the circuit, and the logic values associated with its constituent parts may be displayed simultaneously on the graphical display device 11.

In the case of an alphanumeric display of logic values, the alphanumeric value is displayed in a position physically adjacent to the constituent part to which it refers. In the case of a color display, the color of the constituent part of the circuit is varied according to the logic value to be associated with it. The constituent parts of the circuit with which logic values are associated are generally the interconnections between logic elements though the invention is not limited to variation only of parameters associated with interconnections of logic elements.

As the design analysis software 17 runs through the series of test inputs to the circuit, the displayed logic values change such that the operation of the circuit in response to a variety of circuit input conditions can be dynamically displayed. This can be implemented either instantaneously, changing the displayed logic values depending upon changes at the circuit input, or else the circuit can be clocked slowly through its operation such that the change in state of the logic values at the inputs and outputs of the various logic gates forming the circuit, can be seen and checked.

In addition to the displayed logic values, any design fault in the circuit can be indicated on the screen. This, for example, can occur where a circuit node is seemingly required to assume incompatible logic values simultaneously. In this situation, a distinct visual indication can be made on the screen, either in the form of a contrasting color or by an on/off flashing of that particular node.

Furthermore, the effects of potential manufacturing defects or faults can also be indicated as above. For example, the effects of solder bridges or imperfect solder joints can be displayed. The different effects can be distinguished by using different colors for each or on/off flashing of the signals carrying the faults.

Similarly the testability values of the various nodes within the circuit can be displayed on the screen of the terminal 11. The testability of a circuit node is dependent upon the number of inputs and outputs to and from that node and also how that node interrelates to other nodes within the circuit. Clearly the more complex the interrelation of a node is with other nodes in the circuit, the more difficult it is to test the correctness of the configuration of that node and nodes are assigned testability values related to the ease of testing. These values can be determined by the design analysis software 17 for each of the circuit nodes, and either a numerical value or a predetermined equivalent color, is displayed on the screen of the terminal 11, associated with each of the nodes. If a circuit designer is seeking to increase the testability of certain circuit nodes, the effect on their testability of variations elsewhere in the circuit is instantly displayed on the screen. In other words, the present invention provides information about the circuit being displayed by way of the manner in which the elements of the circuit are displayed.

Referring to FIG. 1b, more specifically, the present invention includes a logic simulator 10 which receives logical circuit description information 12 and input/output waveform description information 14 from the user. In response to this information, the logic simulator 10 provides information about the logic states of each of the elements in the electronic circuit being simulated as a function of time. A logic simulator suitable for use in the present invention is the HILO-2 High Speed Universal Logic Design Simulator, manufactured by Cirrus Computers Limited, of Hampshire, England.

The logic state of information from the logic simulator 10 is received by a waveform display formatter 16 and schematic and logic display formatter 18. Waveform display formatter 16 converts the logic state information into waveforms which waveforms can be displayed on terminal 20. One terminal which is suitable for use as terminal 20 is Model No. VT102, manufactured by Digital Equipment Corporation of Acton, Mass. Waveform display formatter 16 can be any one of the logic analyzers presently available.

Schematic and logic display formatter 18 can be a general purpose computer operating under software control. A suitable computer is the VAX model 11-750 or 11-780 manufactured by Digital Equipment Corporation referred to above. Schematic and logic display formatter 18 receives the logic state information from simulator 10 and information concerning the schematic representation of the electronic circuitry from the user. The latter information is indicated by block 22 in FIG. 1. This information includes the graphical definition of each element, and the location and interconnection of each element in the schematic diagram. Also included are the name of the logic element. The location of each element can be specified by associating the occurrence of an element with an occurrence name and then by designating the location of each occurrence name.

Schematic and logic display formatter 18 includes a logic color key table which specifies the colors to be used in representing the different logic states. The schematic and logic display formatter 18, with reference to the logic color key table, inserts into the element definitions from block 22, a color designation which is indicative of the current logic state of that element. Thus, for each point in time for which logic state information is supplied by logic simulator 10, schematic and logic display formatter 18 will insert appropriate color designations into the element definitions. These modified element definitions are then supplied to a display table 24. Display table 24 stores these element definitions, locations and color designations for access by the display processor circuitry 26.

It is to be understood that the information in display table 24 is typically in a high-level form, as opposed to a bit map form. Display processor 26 preferably includes means for interpreting the high-level graphic information from display table 24 and constructing a bit map therefrom. One suitable display processor is Model GS8000, manufactured by Lexidata Corporation of Billerica, Mass. Display processor 26 then displays the bit map information on a visual display 28 (which can be a raster scanning video display, a color plotter, such as model 7580B, manufactured by Hewlett Packard Company of Sunnyvale, Calif., or other visual display means).

Figure 2:
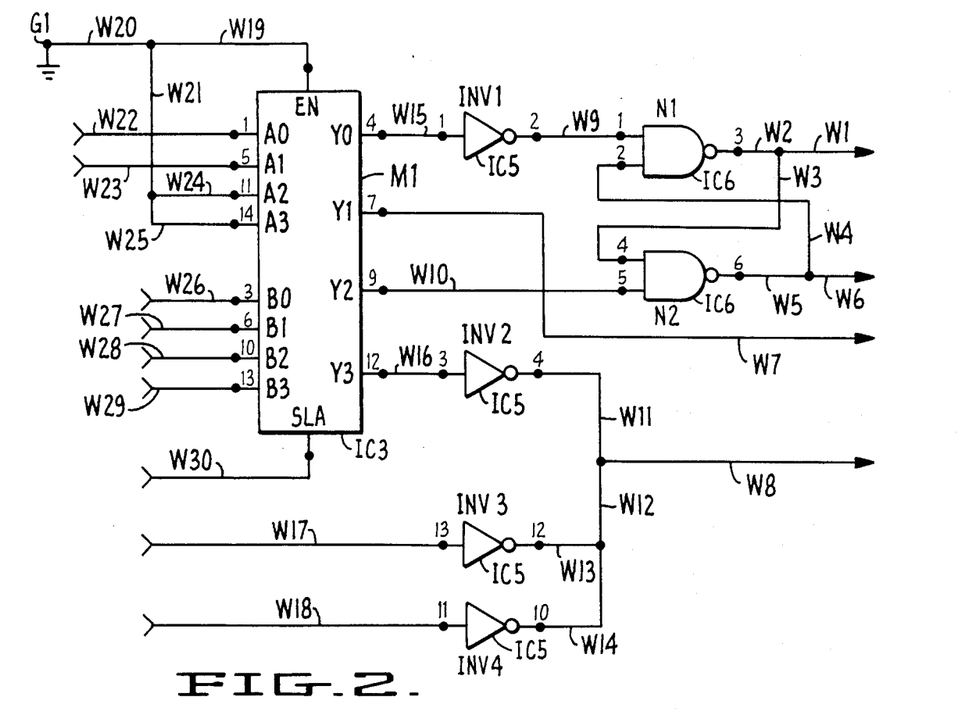
FIG. 2 is an example of an electronic circuit schematic in the form displayed by the present invention.

Referring to FIG. 2, an electronic circuit which is typical of that which can be simulated by the present invention is shown. It can be seen that the schematic diagram of this sample circuit can be by way of plurality of elements definitions including definitions for logic gates, functional blocks and interconnecting wires. Each of these elements is given an element name, such as W1 for wire 1, N1 for NAND gate 1, INV1 for inverter 1, and M1 for multiplexer 1. Associated with each of these elements is a graphical definition by which each element can be positioned on a visual display. For example, wire 2 can be defined as a line having a starting point and an ending point.

N1 can be defined, for example, as an element located at a particular point comprising a number of lines, an arc having a particular radius which extends from a starting point to an ending point, and a circle having a specified radius and positioned at a particular midpoint. In a similar manner, the other elements of the circuit of FIG. 2 can be defined.

Figure 3:
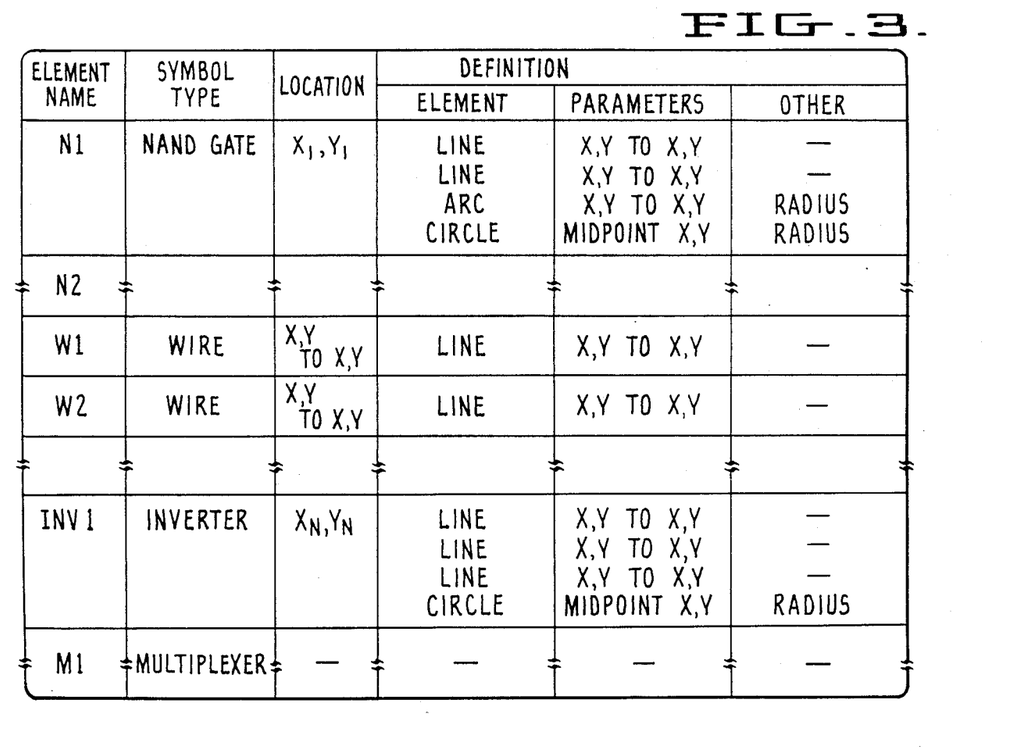
FIG. 3 is a table which illustrates typical element designations, definitions, and locations.

FIG. 3 provides an illustration of how these element definitions and locations can be formed into a table. The table in FIG. 3 is illustrative of the information supplied by the user to schematic and logic display formatter 18.

Figures 4, 6:
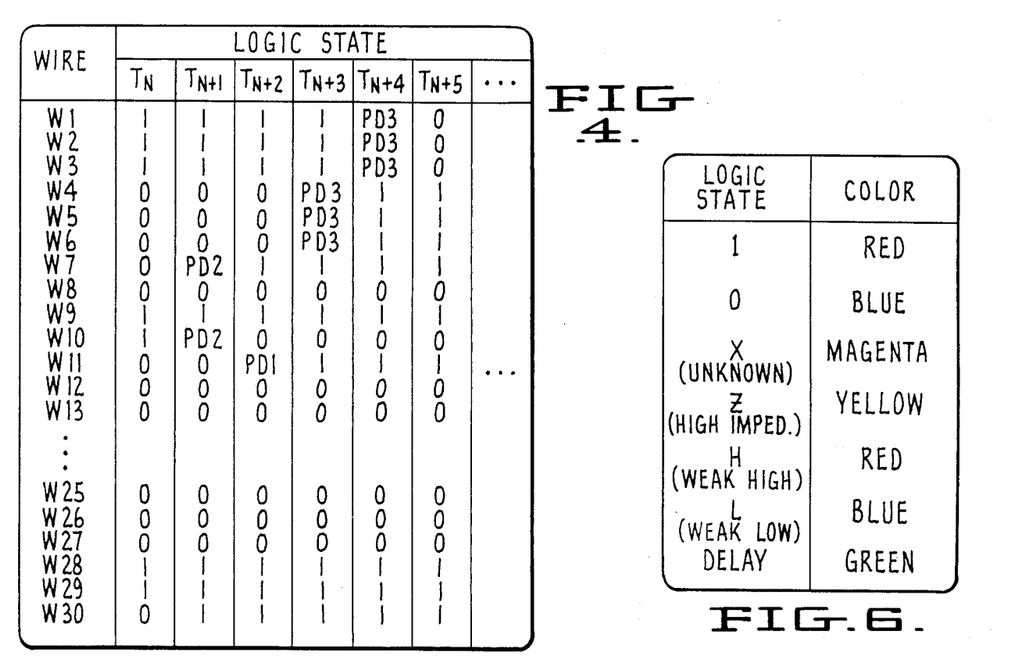
FIG. 4 is a table which illustrates logic state information as supplied by a logic simulator.
FIG. 6 is an example of a color assignment table suitable for use in the present invention.

As discussed above, logic simulator 10 provides the logic states of each of the elements in the electronic circuit as a function of time. FIG. 4 illustrates the kinds of information which can be provided by the logic simulator 10 for the sample circuit shown in FIG. 2. The logical information can be associated with the elements in the sample circuit in several ways. One method is to specify a logic state for each terminal of the elements or functional blocks in the circuit. Another method is to specify the logical states of the wires which interconnect the elements. FIG. 4 illustrates a table in which the latter technique is implemented. Thus, the logical states of selected wires as a function of time are provided in FIG. 4. Among the types of logic states which the logic simulator 10 can specify are a logic 1 and 0, an unknown state, a high impedance state, a weak logic 1 and weak logic 0, and various degrees thereof, and propagation delay information. The states in FIG. 4 show logic 1 and 0 states and delay states in order to simplify the description thereof, it being understood that other of the above possible logic states can also be included in the table.

It is to be understood that the propagation of a fault effect along a data path can also be effectively displayed in accordance with the present invention by displaying the logic states, which have been effected by a particular fault effect, in a particular color, for example, yellow. Thus, the user, by following the signal path displayed in yellow, can trace a fault effect through the circuit. Another logic state which can be indicated is called a "Comparison Failure". That is, the state where the expected logic state on a particular node or wire is different from the logic state actually being produced as a result of the logic simulation. This comparison failure state can also be displayed in a selected color.

Continuing with the example, for time $T_n$, the logic states on the various wires would be as indicated in column $T_n$ of FIG. 4. At time $T_{n+1}$, it can be seen that the logic state on wire 30 changes from a logic 0 to a logic 1. As such, the output states of multiplexer 1 are selected to originate from the "A" set of inputs. Wires 7 and 10 are two output lines of multiplexer 1. At time $T_{n+1}$, a propagation delay type 2 is designated to reflect the response time of the multiplexer to a switch from the "B" inputs to the "A" inputs. At time $T_{n+2}$, the state of wire 30 remains the same, and the states of wire 7 and 10 are shown to have attained their proper values. Assume for purposes of the present example that the logic state applied to wire 23 changes from a logic 1 to a logic 1 at time $T_{n+1}$.

In a similar manner, the logic states at $T_{n+3}$ through $T_{n+1}$ illustrate the propagation of signals through selected wires in the sample circuit. The information illustrated in FIG. 4 is illustrative of the type of information which is supplied from logic simulator 10 to schematic and logic display formatter 18.

Figure 5B:
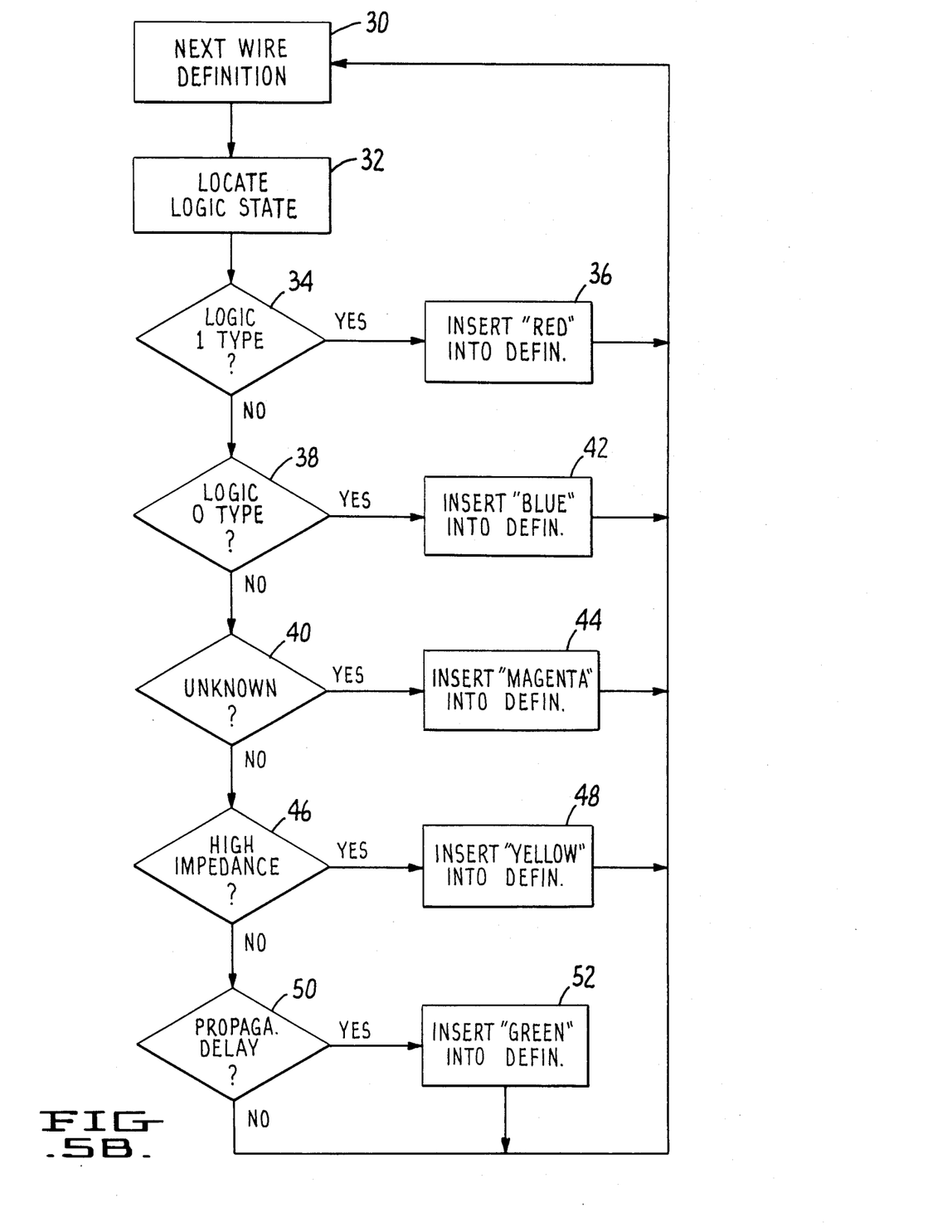

Referring now to FIGS. 5b and 6, the process by which schematic and logic display formatter 18 modifies the element definitions from block 22 with color information will now be described. FIG. 5b provides a generalized block diagram of the above process, while FIG. 6 is a sample table of a logic color key used to designate the appropriate colors.

In step 30, the next wire definition is retrieved. The logic state of the current wire being considered is located in the logic state information from logic simulator 10; see step 32.

In step 34, the logic state is examined to determine whether it is a logic 1 type, i.e., strong 1, weak HI, etc. If so, a color designation of "red" is inserted into the element definition in step 36. Thereafter, the system returns to step 30 to consider the next wire definition.

If in step 34, the logic state was not of the logic 1 type, step 38 is executed to determine whether it is of the logic 0 type. If so, a color "blue" designation is inserted into the definition and the system returns to step 30 for the next wire definition.

If in step 38 the logic state is not a logic 0 type, step 40 is executed to determine whether it is an unknown logic state. If so, in step 44, a color designation of "magenta" is inserted into the element definition. Thereafter, the system returns to step 30 to process the next wire definition.

The above process is repeated to determine whether the logic state is a high impedance or a propagation delay type and the appropriate color designations are inserted into the element definitions. See steps 46, 48, 50 and 52. It is to be understood that the colors specified above were selected for purposes of the above example and that other colors can be employed within the spirit of the present invention.

Figure 7:
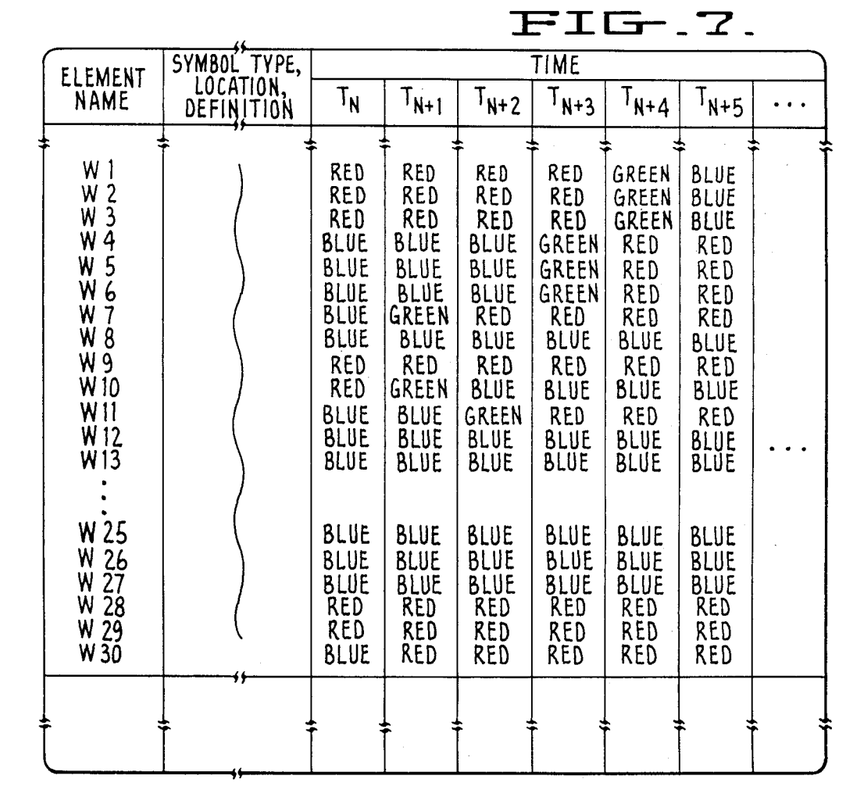
FIG. 7 is a table illustrating the form of information supplied to the display processor in the present invention.

In the above manner, for each segment of time for which logic states are provided by logic simulator 10, schematic and logic display formatter 18 constructs a table in display table 24 of element definitions, locations and color designations. This table is illustrated in FIG. 7. A comparison of FIGS. 4, 6 and 7 will confirm that the table and display table 24 includes element name, symbol type, location and definition, along with color designation. For example, in FIG. 7, in the time $T_{n+1}$ column, the logic 1 state for wire 1 is designated in red; the logic 0 state for wire 4 is designated in blue and the propagation delay state for wire 7 is designated in green.

Display processor 26, as discussed above, is responsive to the symbol type, location, definition, and color designation information and constructs a bit map therefrom. The display processor 26 converts the highlevel definitions, such as arc, line, circle, etc. into appropriate vectors which are then written into the bit map. This bit map is then displayed on display 28.

Figure 8A:
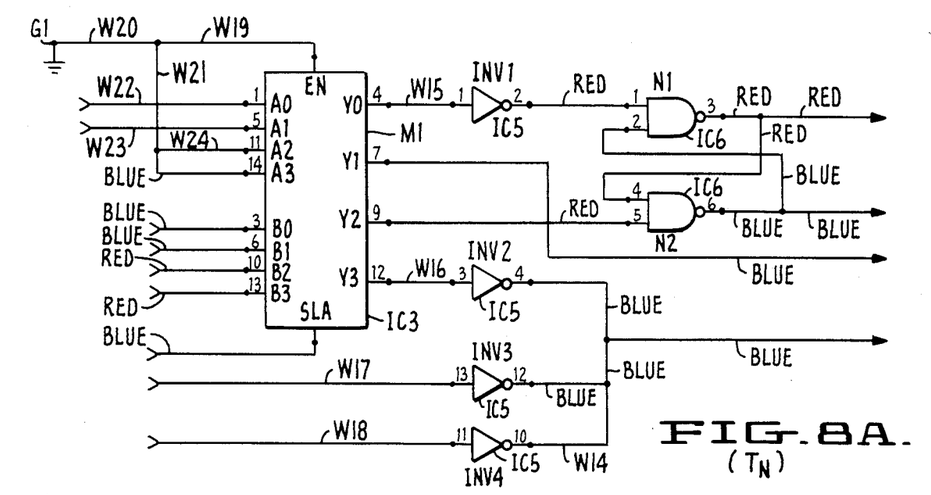
FIGS. 8a through 8c illustrate the image which can be produced on the visual display at selected points in time.
Figure 8B:
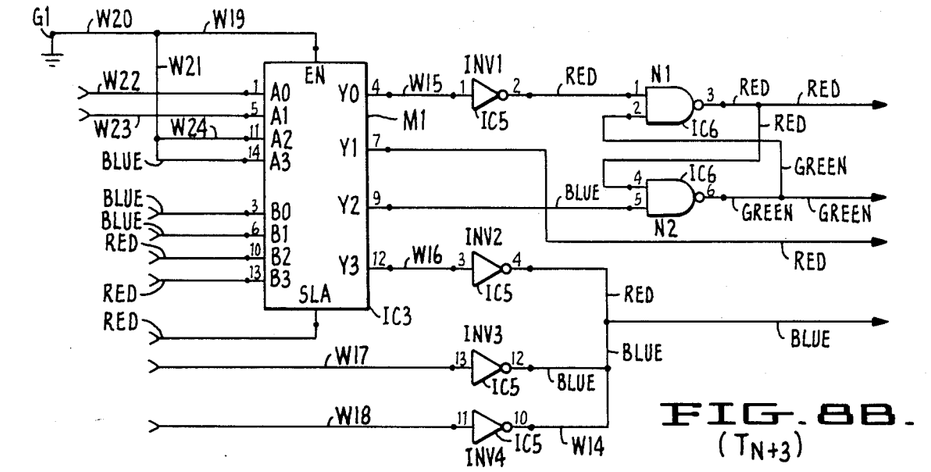
Figure 8C:
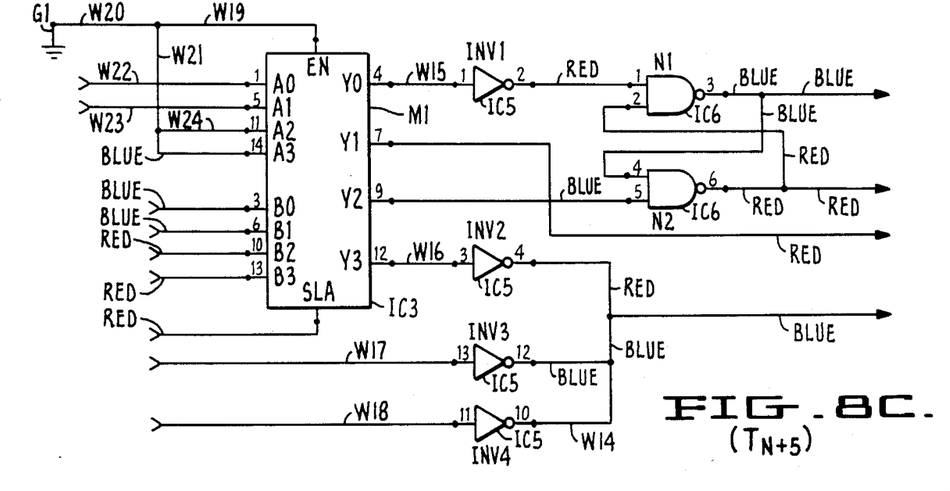

Referring to FIGS. 8a, 8b and 8c, the schematic diagrams which are displayed on display 28 for times $T_n$, $T_{n+3}$, and $T_{n+5}$, are illustrated. It is to be understood, in considering these diagrams, that the colors indicated correspond to the elements listed in FIG. 7, it being understood that colors are not designated for the other element since the logic states for these elements were not defined in the example. Also, it is to be understood that when an element is designated by a certain color, the entire element will appear on the visual display 28 in that color. Thus, in FIG. 8a, wire 10 will be displayed in red, wire 5 will be displayed in blue, and wire 26 will also be displayed in blue. In FIG. 8b, after multiplexer 1 has switched from the B inputs to the A inputs, wire 10 will be displayed in blue, and wire 5 will be displayed in green. Thus, the user will be able to appreciate that, although the input line to IC6 is at a logic 0, there is a propagation delay at the output of IC6 as represented by the green color of wire 5.

Finally, in FIG. 8c, representing time slice $T_{n+5}$, wire 5 will be displayed in red, thus indicating the state value of the logic state as of IC6.

It should therefore be apparent that, as a result of the present invention, the user will be able to visualize the propagation of logic states through the circuit clearly and simply.

In connection with FIGS. 8b and 8c above, the inverters INV2 and INV3 are shown with interconnected outputs. For the corresponding points in time $T_{n+3}$ and $T_{n+5}$, respectively, the logic state of INV2 clashes with that of INV3. The resolution of which logic state prevails is indicated in the Figures by a red wire from INV2 to the remainder of the interconnection network of wires. The interconnection network of wires are blue in color. An alternate mode for indicating the resolution of logic state clashes is to color only the stub portion, i.e. the part of the element between the element input or output and the connection to the interconnection network, signified by a solid dot, of the element which is subordinant in the clash with the element logic value, and then to color the interconnection network with the color corresponding to the dominant logic value. Thus, in FIGS. 8b and 8c, the stub from the output of INV2 can be colored red, with the interconnecting wires colored blue.

Figure 9:
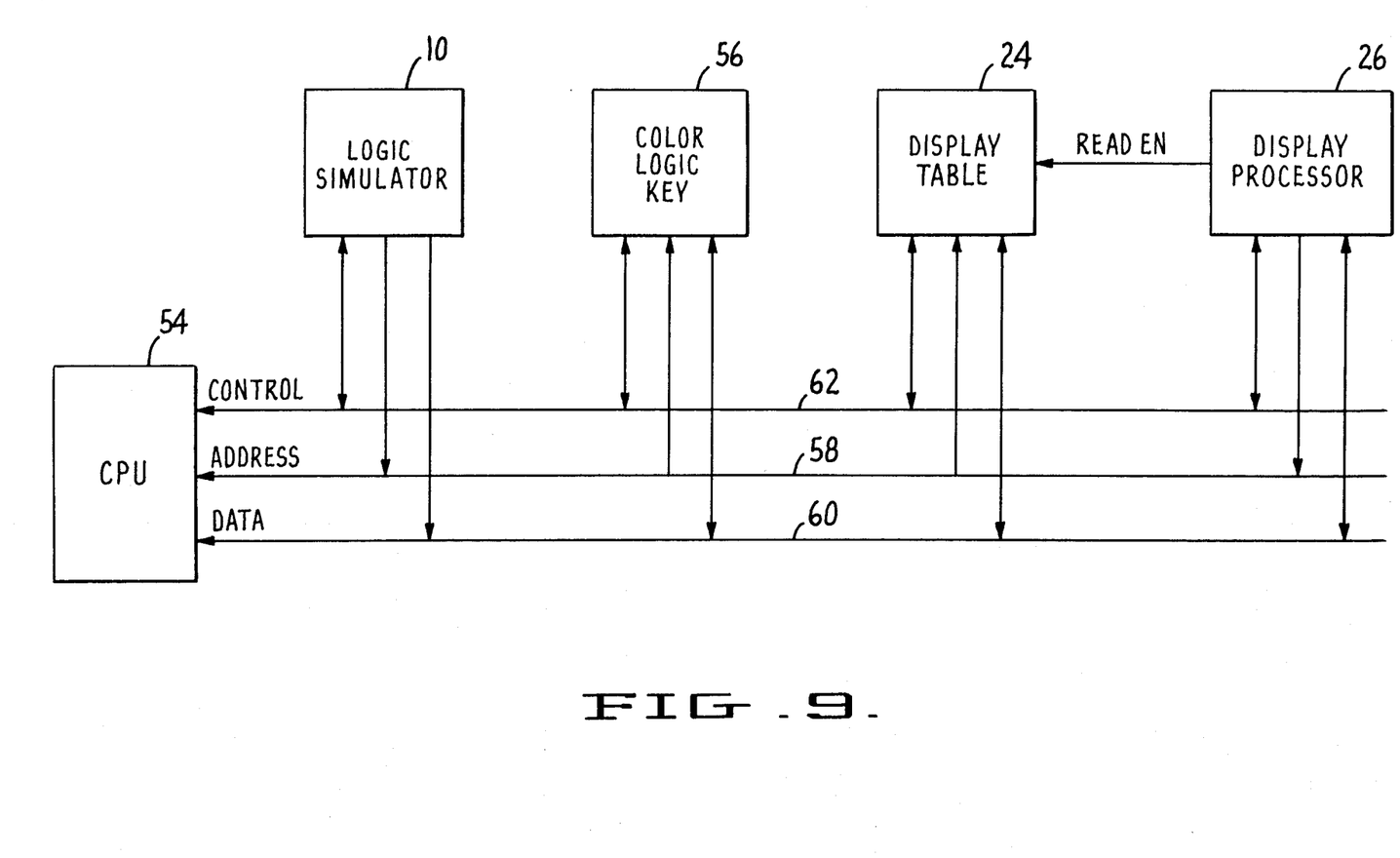
FIG. 9 is a functional block diagram illustrating one scheme for interconnecting the elements shown in FIG. 1b.

Referring to FIG. 9, one embodiment of the present invention will now be described. A central processing unit (CPU) 54 is shown coupled to the logic simulator 10, a color logic key memory 56, the display table 24, and the display processor 26 via and address bus 58, a control bus 62, and a data bus 60. CPU 54 communicates with the logic simulator 10 and the display processor 26 by issuing instructions over the data bus 60 and control information over the control bus 62. The CPU 54 can write information into or read information from the color logic key memory 56 and the display table 24 by issuing read and write control signals on the control bus 62, addresses on the address bus 58, and data on the data bus 60.

Display processor 26 can access the information in the display table 24 by supply appropriate addresses on the address bus 58 and control signals on line 64.

In operation, the CPU 54 receives updated logic state information from logic simulator 10 via data bus 60. In response thereto, CPU 54 accesses color logic key memory 56 for the color designated to represent the particular logic state. Thereafter, CPU 54 retrieves the element definition for the element to which the logic state being processed corresponds, and inserts the designated color into the definition. The modified definition is then reinserted into the display table 24.

The above procedure is repeated as each logic state change is received from the logic simulator 10.

During the display operation of display processor 26, the display processor 26 supplies read enable commands and addresses to the display table 24 to read out the contents thereof. As each element definition is received by the display processor 26, the definition is converted into vectors and written into a bit map within the display processor 26. Thereafter, the contents of the bit map are displayed on the visual display.

The terms and expressions which have been employed here are used as terms of description and not of limitations, and there is no intention, in the use of such terms and expressions of excluding equivalents of the features shown and described, or portions thereof, it being recognized that various modifications are possible within the scope of the invention claimed.

What is claimed is:

1. A visual display system comprising
    means for producing a visual representation of a digital electronic circuit on a display screen by way of a plurality of elements including functional symbols and interconnections therebetween;
    means for indicating on the screen the logical state of some or all of the constituent parts of the elements of said circuit for specified input conditions to said circuit, wherein said logical state is indicated by way of the manner in which an element is displayed; and
    control means for varying said indications of logical state in dependence upon variations in the inputs to said circuit and the reaction of the various elements of said circuit to said variations.

2. The system as recited in claim 1 wherein the indication of logical state is displayed as one of two contrasting colors on said screen.

3. A visual display system comprising
    means for producing a visual representation of a digital electronic circuit on a display screen by way of a plurality of elements including functional symbols interconnected at nodes;
    means for displaying on the screen an indication of the testability value of some or all of the constituent nodes of said circuit wherein said testability is indicated by way of the manner in which the said circuit is displayed at each of said nodes; and
    control means for varying said indications of testability value in dependence upon variations elsewhere in the electronic circuit.

4. The system as recited in claim 3 wherein the indication of testability value is displayed as one of a plurality of contrasting colors on said screen.

5. An improved logic simulation system of the type including a logic simulator responsive to a logical description of a circuit to be simulated and to input and output stimulus data, which logic simulator provides logic state information about the response of the circuit as a function of time; schematic and display formatting means responsive to the logic state information and to schematic element definitions and locations of the circuit to be simulated, for correlating the schematic element definitions and location with the logic state information; and display processor means responsive to the correlated element definition, location and logic state information for converting said information into a visual image, wherein the improvement comprises
    formatting means responsive to the logic state information and to the schematic element definitions and locations for inserting into the element definition a designation of the color in which the element is to be displayed, which color is representative of the logic state of the element.

6. The improved logic simulation system of claim 5, wherein the logical description of the circuit includes the designation of wires which interconnect the logic elements of the circuit, and the logic simulator designates the logic states of the wires as a function of time, and further wherein included among the schematic element definitions are the definitions of the sires which interconnect the logic elements, and further wherein the formatting means modify the schematic element definitions for each wire modified to include a color designation, which designation is representative of its logic state at a selected point in time, so that each wire is displayed in a color which represents the logic state of the wire at the selected point in time.

7. The improved logic simulation system of claim 6 wherein the formatting means include
    logic color key means for designating what colors represent what logic states;
    means responsive to the logic state information designated for each wire and coupled to the logic color key means for selecting the corresponding logic color; and
    means responsive to the selected logic colors for each wire and to the element definitions for each wire for inserting the logic color information into the element definitions for each wire.

8. The improved logic simulation system of claim 7, wherein logic one type states are displayed in one color and logic zero type states are displayed in another color.

9. The improved logic stimulation system of claim 8, wherein logic one type states are displayed in red and logic zero type states are displayed in blue.

10. The improved logic simulation system of claim 7, wherein unknown logic states and high impedance states of the circuit elements are displayed in different colors.

11. A logic stimulation system providing a visual display of an electronic circuit being simulated, wherein the electronic circuit is displayed by way of a plurality of interconnected elements, and further wherein the logical states of the elements therein are displayed by displaying the elements in predetermined colors.

12. The logic simulation system as recited in claim 11 further including means for displaying design faults in the circuit being simulated.

13. The logic simulation system as recited in claim 12, wherein the design faults being displayed are designated by a predetermined color.

14. The logic simulation system as recited in claim 12, wherein the design faults being displayed are designated by an on/off flashing of the fault area.

15. The logic simulation system as recited in claim 11, further including means for displaying manufacturing fault effects.

16. The logic simulation system as recited in claim 15, wherein the manufacturing fault effects displayed are designated by predetermined colors.

17. The logic simulation system as recited in claim 15, wherein the manufacturing fault effects displayed are designated by on/off flashing of the signals carrying the faults.

* * * * *